United States Patent
Shiina

(10) Patent No.: US 11,626,802 B2
(45) Date of Patent: Apr. 11, 2023

(54) DETECTION CIRCUIT AND DC-DC CONVERTER

(71) Applicant: ABLIC Inc., Tokyo (JP)

(72) Inventor: Yoshiomi Shiina, Tokyo (JP)

(73) Assignee: ABLIC Inc., Tokyo (JP)

( * ) Notice: Subject to any disclaimer, the term of this patent is extended or adjusted under 35 U.S.C. 154(b) by 89 days.

(21) Appl. No.: 17/389,347

(22) Filed: Jul. 30, 2021

(65) Prior Publication Data
US 2022/0069717 A1  Mar. 3, 2022

(30) Foreign Application Priority Data

Aug. 27, 2020  (JP) .............................. JP2020-143414

(51) Int. Cl.
*H02M 3/158* (2006.01)
*G01R 19/14* (2006.01)
*H02M 1/00* (2006.01)

(52) U.S. Cl.
CPC .......... *H02M 3/1588* (2013.01); *G01R 19/14* (2013.01); *H02M 1/0009* (2021.05)

(58) Field of Classification Search
CPC .. H02M 3/1588; H02M 1/0009; H02M 3/158; G01R 19/14
See application file for complete search history.

(56) References Cited

U.S. PATENT DOCUMENTS

| | | | | |
|---|---|---|---|---|
| 6,724,174 B1* | 4/2004 | Esteves | ................. | H02M 3/155 323/224 |
| 2008/0036443 A1* | 2/2008 | Kojima | ............... | H02M 3/1588 323/351 |
| 2008/0136383 A1* | 6/2008 | Hasegawa | ........... | H02M 3/1588 323/271 |
| 2008/0290854 A1* | 11/2008 | Uchiike | .............. | H02M 3/1588 323/284 |
| 2009/0128109 A1 | 5/2009 | Brinkman | | |

FOREIGN PATENT DOCUMENTS

| | | |
|---|---|---|
| JP | 2006060977 | 3/2006 |
| JP | 2008514177 | 5/2008 |
| JP | 2019103199 | 6/2019 |

\* cited by examiner

*Primary Examiner* — Kyle J Moody
(74) *Attorney, Agent, or Firm* — JCIPRNET

(57) ABSTRACT

A DC-DC converter of a synchronous rectification type includes a synchronous rectification transistor and a backflow detection circuit which detects a reverse current based on a voltage across the synchronous rectification transistor. The backflow detection circuit includes a first-stage differential input circuit including a first transistor, a first resistor, a second transistor, a second resistor and a fifth transistor, and a second-stage differential input circuit including a third transistor and a fourth transistor. The fifth transistor is of a same conductive type as the synchronous rectification transistor and contains a drain connected to the other end of the first resistor with respect to an end connected to the first transistor.

10 Claims, 11 Drawing Sheets

DETECTION CIRCUIT AND DC-DC CONVERTER

CROSS-REFERENCE TO RELATED APPLICATION

This application claims the priority benefit of Japan application serial no. 2020-143414, filed on Aug. 27, 2020. The entirety of the above-mentioned patent application is hereby incorporated by reference herein and made a part of this specification.

BACKGROUND

Technical Field

The present invention relates to a detection circuit and a DC-DC converter.

Description of Related Art

A DC-DC converter is a device including a function of converting a DC input voltage into a different DC output voltage. Among the DC-DC converters, for example, the synchronous rectification type converter can improve the power conversion efficiency by turning off the synchronous rectification transistor serving as a synchronous rectifier at the time of light load such as standby (see Japanese Patent Application Laid-Open No. 2019-103199). The closer the coil current is to 0 (zero) amperes, from the viewpoint of obtaining higher efficiency, the more advantageous the timing at which the synchronous rectification transistor is turned off is. For the purpose of obtaining higher efficiency, in the synchronous rectification type converter, a backflow detection circuit detects the voltage across the synchronous rectification transistor and turns off the synchronous rectification transistor at the timing when the coil current becomes 0 amperes.

However, the resistance value of the on-resistance of the synchronous rectification transistor varies depending on the so-called Process-Voltage-Temperature (PVT) variation. Fluctuations in the resistance value of the on-resistance of the synchronous rectification transistor make the detected coil current value fluctuate. For example, if the on-resistance of the synchronous rectification transistor fluctuates to a value greater than the design value, the timing at which the synchronous rectification transistor is turned off is delayed. The delay of the timing at which the synchronous rectification transistor is turned off causes the electric charge of the output capacitor to be discharged, thereby reducing the power conversion efficiency.

SUMMARY

In consideration of the above circumstances, the present invention provides a detection circuit and a DC-DC converter which suppress a decrease in the power conversion efficiency even if the resistance value of the on-resistance of the synchronous rectification transistor fluctuates.

A detection circuit according to an embodiment of the present invention is a detection circuit which includes two input terminals to be connected to a synchronous rectification transistor, and which detects a reverse current based on a voltage across the synchronous rectification transistor. The detection circuit includes: a first-stage differential input circuit including a first input port as one of the two input terminals, a second input port as the other one of the two input terminals, a first transistor containing a gate connected to the first input port, a first resistor containing first and second ends, the first end being connected in series with the first transistor, a second transistor containing a gate connected to the second input port, a second resistor connected in series with the second transistor, and a fifth transistor being of a same conductive type as the synchronous rectification transistor, the fifth transistor containing a drain connected to the second end of the first resistor; and a second-stage differential input circuit including a third transistor containing a gate connected to a node between the first transistor and the first resistor, and a fourth transistor containing a gate connected to a node between the second transistor and the second resistor.

A DC-DC converter according to an embodiment of the present invention is a DC-DC converter of a synchronous rectification type including a synchronous rectification transistor and a backflow detection circuit which detects a reverse current based on a voltage across the synchronous rectification transistor. The backflow detection circuit includes: a first-stage differential input circuit including a first input port, a second input port, a first transistor containing a gate connected to the first input port, a first resistor connected in series with the first transistor, a second transistor including a gate connected to a second input port, a second resistor connected in series with the second transistor, and a fifth transistor being of a same conductive type as the synchronous rectification transistor, the fifth transistor containing a drain connected to the second end of the first resistor; and a second-stage differential input circuit including a third transistor containing a gate connected to a node between the first transistor and the first resistor, and a fourth transistor containing a gate connected to a node between the second transistor and the second resistor.

According to the present invention, a decrease in the power conversion efficiency can be suppressed even if the resistance value of the on-resistance of the synchronous rectification transistor fluctuates.

DESCRIPTION OF THE EMBODIMENTS

Hereinafter, a DC-DC converter according to embodiments of the present invention will be described with reference to the drawings.

First Embodiment

Figure 1:
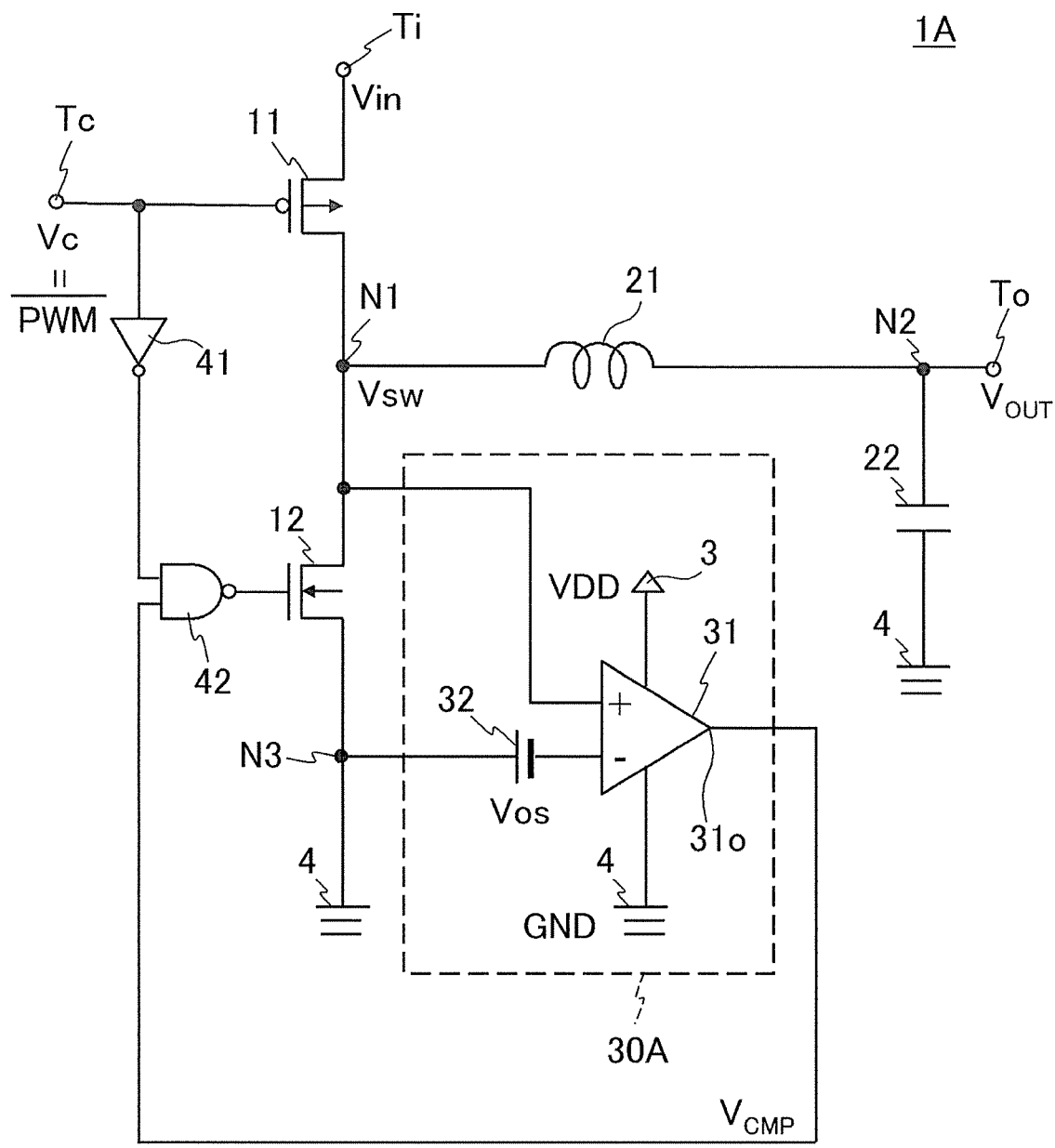
FIG. 1 is a circuit diagram of a DC-DC converter according to a first embodiment of the present invention.

FIG. 1 is a circuit diagram of a DC-DC converter 1A which is an example of a DC-DC converter according to a first embodiment.

The DC-DC converter 1A is a so-called synchronous rectification type step-down DC-DC converter. The DC-DC converter 1A includes a PMOS transistor 11, an NMOS transistor 12, an inductor 21, an output capacitor 22, a backflow detection circuit 30A, and an inverter 41 and a NAND circuit 42 which form a control circuit. The backflow detection circuit 30A is configured by a comparator 31 including an offset voltage.

The PMOS transistor 11 includes a gate connected to a control terminal Tc, a source connected to an input terminal Ti, and a drain connected to a node N1 between a drain of the NMOS transistor 12 and a first end of the inductor 21.

The NMOS transistor 12 as a synchronous rectification transistor includes a gate connected to an output port of the NAND circuit 42, the drain connected to the node N1, and a source connected to a ground terminal 4.

The inductor 21 includes the first end connected to the drain of the NMOS transistor 12 and a second end connected to an output terminal To. The output capacitor 22 is connected between a node N2 between the second end of the inductor 21 and the output terminal To and the ground terminal 4. An output voltage $V_{OUT}$ is output from the output terminal To to an external circuit (not illustrated) connected to the output terminal To.

The backflow detection circuit 30A includes, equivalently, the comparator 31 and an offset voltage source 32 which generates an offset voltage including an offset voltage value Vos. The comparator 31 includes a non-inverting input port (+) connected to the node N1 and an inverting input port (−) connected to a node N3 between the source of the NMOS transistor 12 and the ground terminal 4 via the offset voltage source 32. The offset voltage source 32 includes a positive electrode connected to the node N3 and a negative electrode connected to the inverting input port (−).

The comparator 31 includes a positive power supply port connected to a power supply terminal 3 and a negative power supply port connected to the ground terminal 4. The power supply terminal 3 as the power supply terminal supplies a voltage VDD as a power supply voltage. The ground terminal 4 as a power supply terminal supplies a ground voltage GND as a power supply voltage. The voltage VDD is a voltage higher than the ground voltage GND.

Figure 2:
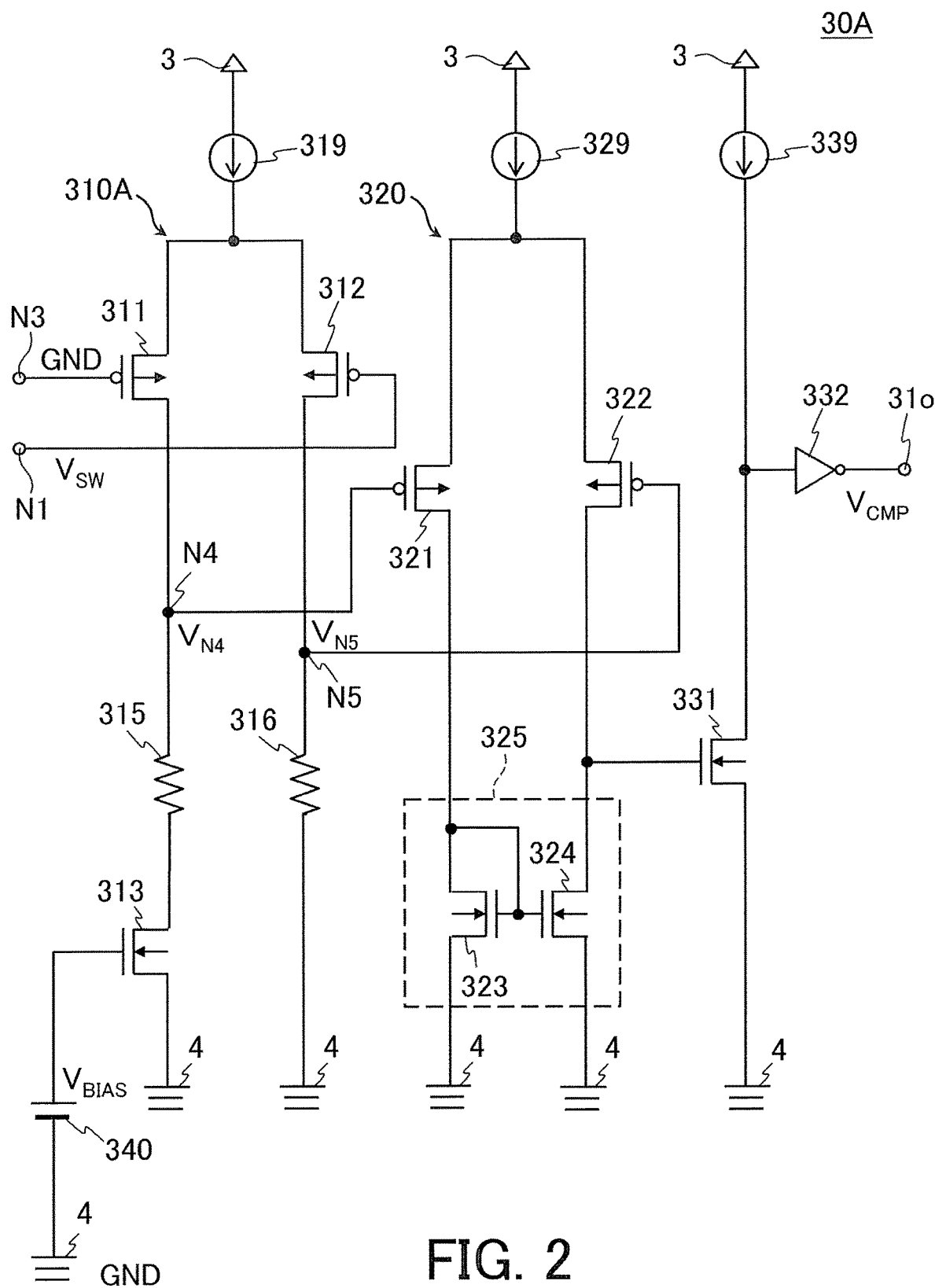
FIG. 2 is a circuit diagram illustrating a configuration example (first configuration example) of the backflow detection circuit according to the first embodiment.

FIG. 2 is a circuit diagram illustrating the backflow detection circuit 30A which is a first configuration example of the backflow detection circuit in the DC-DC converter according to the first embodiment.

The backflow detection circuit 30A includes first- and second-stage differential input circuits 310A and 320 which configure a multi-stage (such as two-stage) differential input circuit, an NMOS transistor 331, an inverter 332, and a constant current source 339 which supplies a constant current to the NMOS transistor 331.

The first-stage differential input circuit 310A includes a PMOS transistor 311 as a first transistor, a PMOS transistor 312 as a second transistor, a resistor 315 as a first resistor, and a resistor 316 as a second resistor. A constant current source 319 which supplies a constant current to the PMOS transistors 311 and 312 is connected between each source of the PMOS transistors 311 and 312 and the power supply terminal 3. Further, the first-stage differential input circuit 310A further includes an NMOS transistor 313 which is of the same conductive type as the NMOS transistor 12, the NMOS transistor 313 serving as an n-type fifth transistor.

The PMOS transistor 311 includes a gate connected to the node N3 as a first input port. The PMOS transistor 312 includes a gate connected to the node N1 as a second input port.

The resistors 315 and 316 are load resistors in the first-stage differential input circuit 310A. The resistors 315 and 316 are connected in series with the PMOS transistors 311 and 312, respectively. Here, the connection point between the resistor 315 and a drain of the PMOS transistor 311 is referred to as a node N4, and the connection point between the resistor 316 and a drain of the PMOS transistor 312 is referred to as a node N5.

The resistor 315 includes a first end, as one end, connected to the drain of the PMOS transistor 311 and a second end, as the other end with respect to the one end, connected to a drain of the NMOS transistor 313. The resistor 316 includes a first end connected to the drain of the PMOS transistor 312 and a second end connected to the ground terminal 4. The resistance values of the resistors 315 and 316 may be the same value or different values.

The NMOS transistor 313 includes a gate connected to a bias circuit 340 which supplies a bias voltage $V_{BIAS}$, the drain connected to the second end of the resistor 315, and a source connected to the ground terminal 4.

The second-stage differential input circuit 320 includes a PMOS transistor 321 as a third transistor and a PMOS transistor 322 as a fourth transistor. A drain of an NMOS transistor 323 is connected to a drain of the PMOS transistor 321. A drain of an NMOS transistor 324 is connected to a drain of the PMOS transistor 322. A constant current source 329 which supplies a constant current to the PMOS transistors 321 and 322 is connected between each source of the PMOS transistors 321 and 322 and the power supply terminal 3.

The PMOS transistor 321 includes a gate connected to the node N4. The PMOS transistor 322 includes a gate connected to the node N5.

The NMOS transistor 323 includes the drain connected to the drain of the PMOS transistor 321, a gate connected (short-circuited) to its own drain, and a source connected to the ground terminal 4. The NMOS transistor 324 includes a gate connected to the gate and drain of the NMOS transistor 323, the drain connected to the drain of the PMOS transistor 322, and a source connected to the ground terminal 4. The NMOS transistors 323 and 324 configure a current mirror circuit 325.

The NMOS transistor 331 is an output transistor in the backflow detection circuit 30A. The NMOS transistor 331 includes a gate connected to a node between the PMOS transistor 322 and the NMOS transistor 324, a drain connected to the power supply terminal 3 via the constant current source 339, and a source connected to the ground terminal 4. The inverter 332 includes an input port connected to a node between the constant current source 339 and the NMOS transistor 331, and an output port connected to an output port 31o.

Subsequently, the operation of the DC-DC converter 1A will be described.

Figure 3:
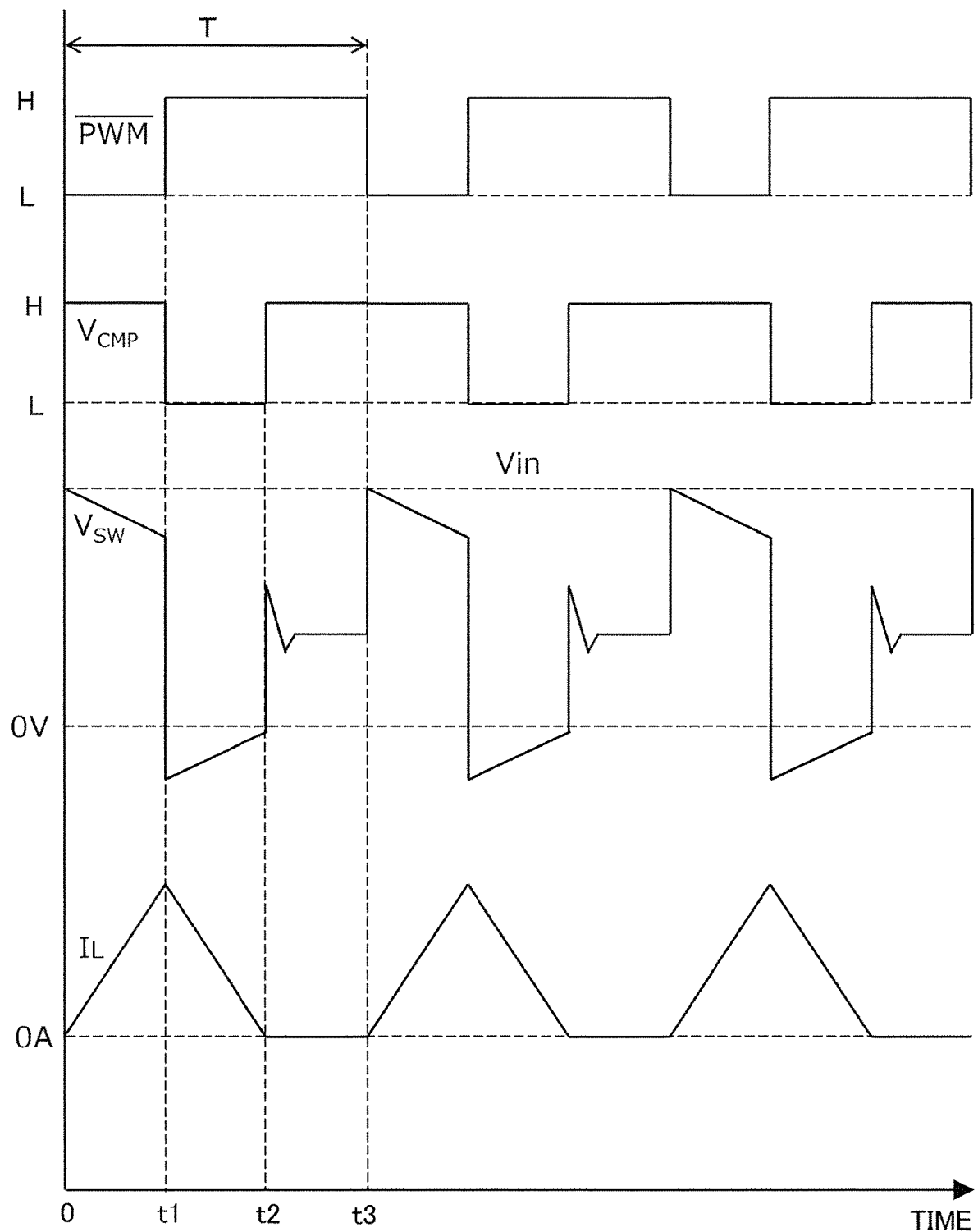
FIG. 3 is an explanatory diagram schematically illustrating the operation waveform of the DC-DC converter according to the first embodiment.

FIG. 3 is an explanatory diagram schematically illustrating a voltage Vc of the control terminal Tc, a voltage $V_{CMP}$ of the output port 31o, a voltage Vsw of the node N1, and a coil current $I_L$ flowing through the inductor 21 as the operation waveform of the DC-DC converter 1A. Further, in FIG. 3, from the viewpoint of simplification of the figure, the dead time period during which the PMOS transistor 11 and the NMOS transistor 12 are turned off at the same time is omitted. Further, the PWM with an upper bar illustrated in FIG. 3 indicates that the timing at which the voltage Vc turns on the PMOS transistor 11 is at the low (L) level.

The voltage Vc, the voltage $V_{CMP}$, the voltage Vsw, and the coil current $I_L$ all change periodically with a period T. The voltage Vc maintains the L level from time 0 to before time t1, transitions to the high (H) level at time t1, maintains the H level from time t1 to before time t3, and transitions to the L level at time t3. In accordance with the transition of the voltage Vc, the PMOS transistor 11 maintains the on state from time 0 to before time t1, is turned off at time t1, maintains the off state from time t1 to before time t3, and is turned on at time t3.

The voltage $V_{CMP}$ maintains the H level from time 0 to before time t1, transitions to the L level at time t1, maintains the L level from time t1 to before time t2, transitions to the H level at time t2, and maintains the H level from time t2 to time t3. In accordance with the transition of the voltage $V_{CMP}$, the NMOS transistor 12 maintains the off state from time 0 to before time t1, is turned on at time t1, maintains the on state, and then is turned off at time t3.

The coil current $I_L$ increases at a constant rate from time 0 to time t1. At time t1, the coil current $I_L$ decreases at a constant rate as the PMOS transistor 11 is turned off and the NMOS transistor 12 is turned on. During time t1 to t2, the coil current $I_L$ decreases at a constant rate. At time t2, the coil current $I_L$ becomes 0 amperes, and then maintains at 0 amperes ($I_L$=0) to before time t3.

The voltage Vsw decreases at a constant rate from the input voltage Vin from time 0 to before time t1, and at time t1, it drops to a negative voltage as the PMOS transistor 11 is turned off and the NMOS transistor 12 is turned on, and then increases at a constant rate towards 0 volts. At time t2, the coil current $I_L$ becomes 0 amperes, and the change of the coil current $I_L$ stops. Because no change of the coil current $I_L$ leads to that the voltage difference between the two ends of the inductor 21 becomes 0 volts, the voltage between the node N1 and the node N2 is balanced, and the voltage rises to a predetermined positive voltage lower than the input voltage Vin. The positive voltage is maintained from time t2 to before time t3, and at time t3, the voltage Vsw rises to a voltage equal to the input voltage Vin as the PMOS transistor 11 is turned on and the NMOS transistor 12 is turned off.

Figure 4:
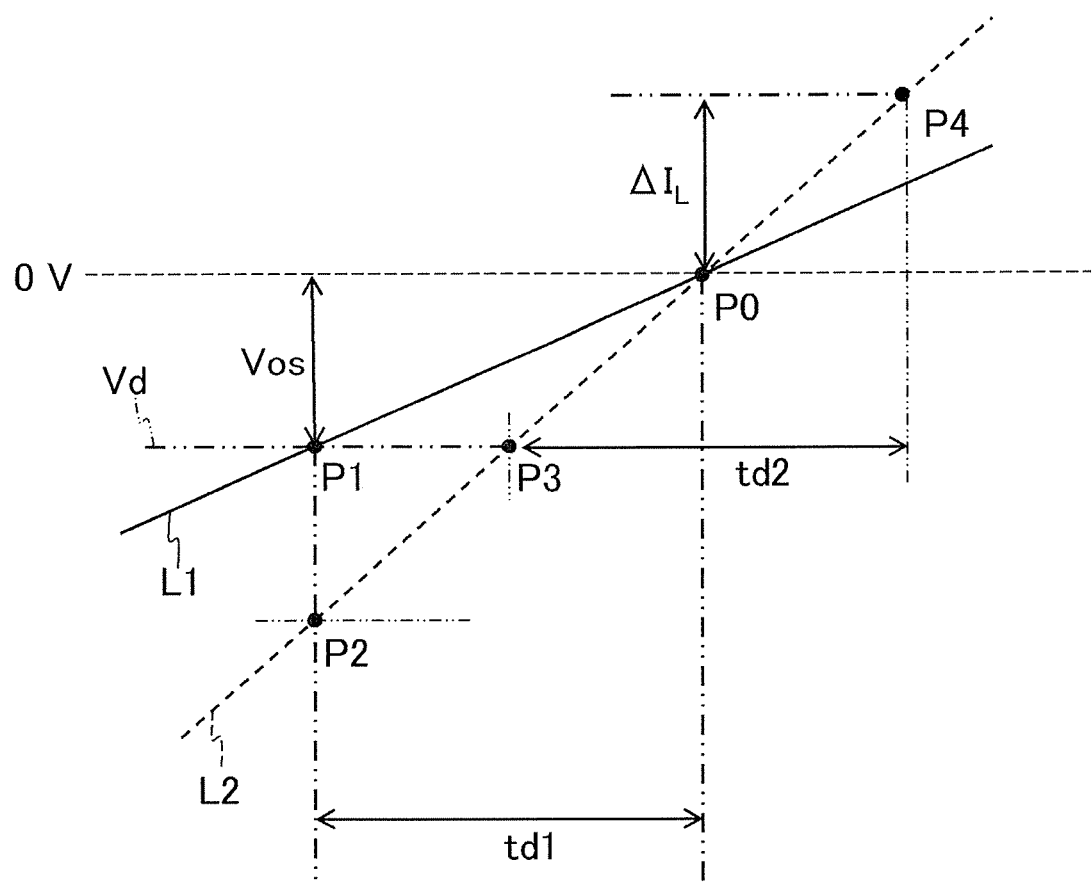
FIG. 4 is an explanatory diagram illustrating an offset voltage generated in the backflow detection circuit.

FIG. 4 is an explanatory diagram illustrating an offset voltage generated in the backflow detection circuit 30A. The solid line L1 indicates the characteristics of the voltage Vsw generated at the node N1, and the broken line L2 indicates the characteristics of the voltage Vsw after the on-resistance value Ron12 of the NMOS transistor 12 becomes large for some reason.

The backflow detection circuit 30A includes an offset voltage in a detection voltage Vd.

That is, the backflow detection circuit 30A is set with the offset voltage value Vos in consideration of a delay time td1 of the response of the comparator 31. The offset voltage value Vos may be expressed by the product of the on-resistance value Ron12 and the coil current $I_L$ of the inductor 21. That is, the offset voltage value Vos (=Ron12·$I_L$) becomes equal to the voltage value of the detection voltage Vd. The offset voltage value Vos is set so that the voltage value of the detection voltage Vd becomes negative (Vd<0) (point P1).

The voltage Vsw generated at the node N1 is indicated by the solid line L1. The solid line L1 is a straight line passing through the points P1 and P0, and is obtained by the product of the on-resistance value Ron12 and the coil current $I_L$ of the inductor 21. The voltage value of the voltage Vsw is accordingly equal to the offset voltage value Vos and the voltage value of the detection voltage Vd. The timing at which the backflow detection circuit 30A detects the voltage is the point P1 which is the intersection of the solid line L1 and the detection voltage Vd. After the backflow detection circuit 30A detects the voltage, the voltage $V_{CMP}$ is inverted at the timing delayed by the delay time td1 of the response of the comparator 31, i.e., at the point P0 which is the intersection with 0 volts, and the NMOS transistor 12 is turned off to prevent the backflow of the coil current $I_L$.

Next, a case where the on-resistance value Ron12 becomes large for some reason (the broken line L2) will be described. Here, it is assumed that the offset voltage value Vos and a delay time td2 do not change with the change of the on-resistance value Ron12. That is, for the delay time of the response of the comparator 31, the delay time td2 is equal to the delay time td1.

The voltage Vsw in the case where the on-resistance value Ron12 becomes large is indicated by the broken line L2. The broken line L2 is a straight line passing through the points P3 and P0. Even if the coil current $I_L$ is the same, the absolute value |Vsw| of the voltage Vsw generated by the on-resistance of the NMOS transistor 12 and the coil current $I_L$ becomes large. Here, if the offset voltage value Vos is the same, the detected current value of the coil current $I_L$ becomes smaller. The slope in a case where the current value of the coil current $I_L$ decreases is expressed by the product of the output voltage Vout and the reciprocal of the inductance L of the inductor 21, that is, Vout/L. Even if the on-resistance value Ron12 changes, Vout/L serving as the above-mentioned slope hardly changes, but the absolute value |Vsw| of the voltage Vsw becomes large.

Here, on a condition that the offset voltage value Vos does not change, even if the detection voltage Vd is the same, the change of the voltage Vsw is steep. The steep change of the voltage Vsw results to generate a backflow of the coil current $I_L$ at the point P4 after the delay time td2 elapses from the point P3 where the voltage is detected. The backflow of the coil current $I_L$ is, expressed by $\Delta I_L$, a reverse current which is a current in the direction from the node N2 to the node N1. Since $\Delta I_L$ is a discharge operation from the output capacitor 22, the power conversion efficiency is lowered. On the contrary, if the on-resistance value Ron12 becomes small, the voltage $V_{CMP}$ is inverted before the voltage Vsw reaches 0 volts. This inversion of the voltage $V_{CMP}$ results that the operation is likely to deviate from the ideal operation, and the power conversion efficiency is likely to decrease.

Thus, in the backflow detection circuit 30A, the offset voltage of the comparator 31 (see FIG. 1) is generated by the on-resistance of the NMOS transistor 313 of the same conductive type as the NMOS transistor 12 (see FIG. 1) serving as the synchronous rectification transistor.

Since the NMOS transistor 12 and the NMOS transistor 313 are of the same conductive type, even if the on-resistance value Ron12 changes due to the temperature, the input voltage, or the manufacturing variation (PVT variation), the on-resistance value Ron313 of the NMOS transistor 313 changes in the same way. This means that, if conceptually explained by using the example illustrated in FIG. 4, even if the on-resistance value Ron12 changes, the offset voltage value Vos automatically moves from the point P1 to the point P2. In other words, the offset voltage value Vos automatically changes in the direction in which the power conversion efficiency is unlikely to decrease in response to the change of the on-resistance value Ron12, and the power conversion efficiency can be less likely to decrease.

Figure 5:
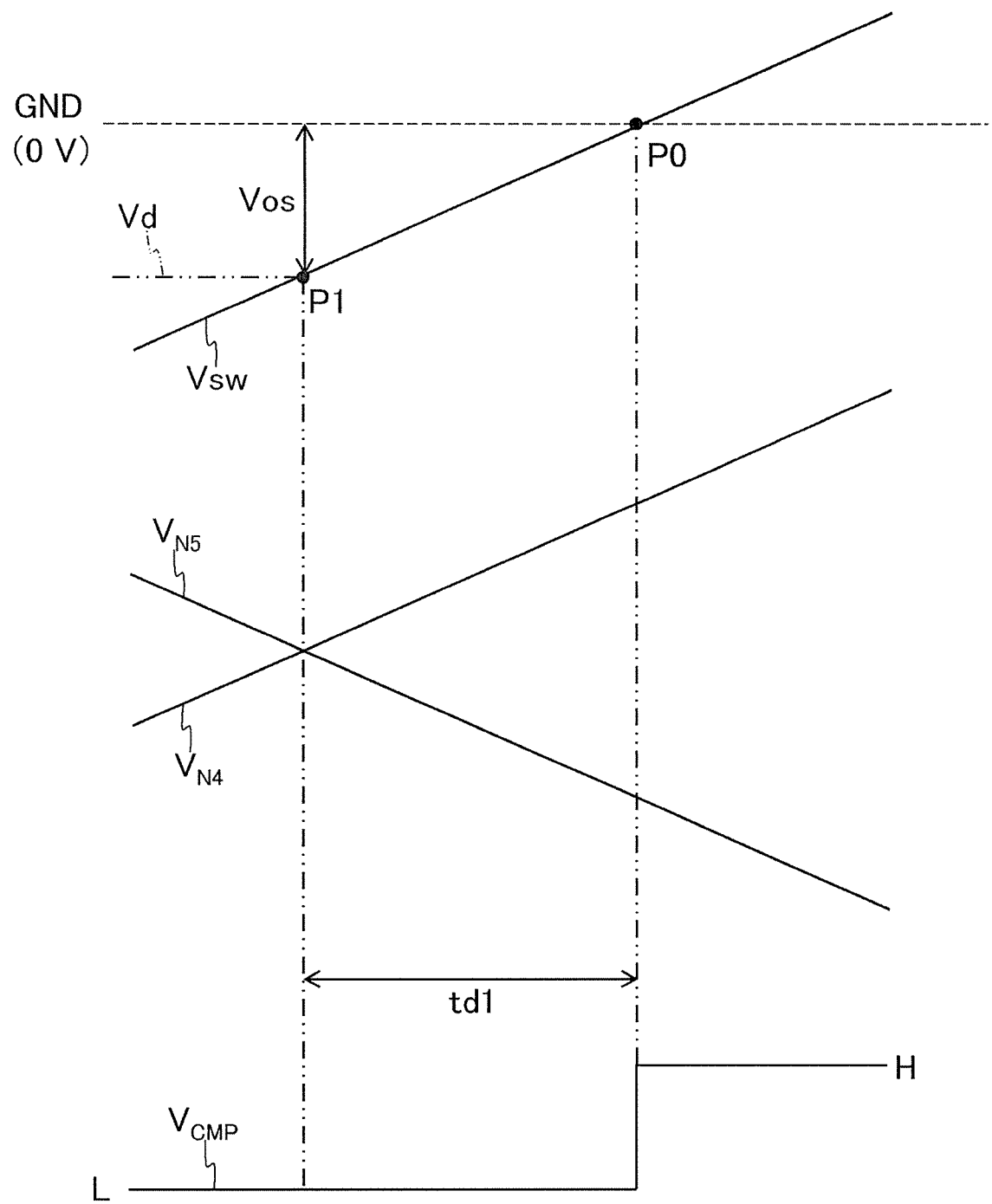
FIG. 5 is an explanatory chart illustrating the relationship, with respect to time, of the detection voltage, the offset voltage and the voltage at the non-inverting input port, a voltage at the first input port, a voltage at the second input port of the second-stage differential input circuit in the backflow detection circuit, and the voltage of the output port.

FIG. 5 is an explanatory chart illustrating the relationship, with respect to time, of the detection voltage Vd, the offset voltage value Vos and the voltage Vsw at the non-inverting input port (+); a voltage $V_{N4}$ and a voltage $V_{N5}$ which are a first input voltage and a second input voltage of the second-stage differential input circuit 320; and the voltage $V_{CMP}$ of the output port 31o.

The voltage Vsw is the product of the on-resistance value Ron12 and the coil current $I_L$ of the inductor 21. The detection voltage Vd, the offset voltage value Vos, the points P0 and P1, and the delay time are the same as those in FIG. 3. As the voltage Vsw approaches the point P0 from the point P1, that is, approaches 0 volts from the negative voltage (Vsw<0), the first input voltage of the second-stage differential input circuit 320, i.e., the voltage $V_{N4}$ increases, and the second input voltage of the second-stage differential input circuit 320, i.e., the voltage $V_{N5}$ decreases.

In the backflow detection circuit 30A, since the on-resistance value Ron313 of the NMOS transistor 313 is added to the resistor 315, the voltage $V_{N4}$ increases and the offset voltage value Vos is generated. The generated offset voltage value Vos is determined based on the on-resistance value Ron313, each gate-source voltage of the PMOS transistors 311 and 312, each threshold voltage, and the resistance values of the resistors 315 and 316. The voltage Vey of the output port 31o is inverted from the L level to the H level after the delay time td1 elapses from the timing when the voltage $V_{N4}$ =the voltage $V_{N5}$ before the voltage Vsw reaches 0 volts.

Figure 6A:
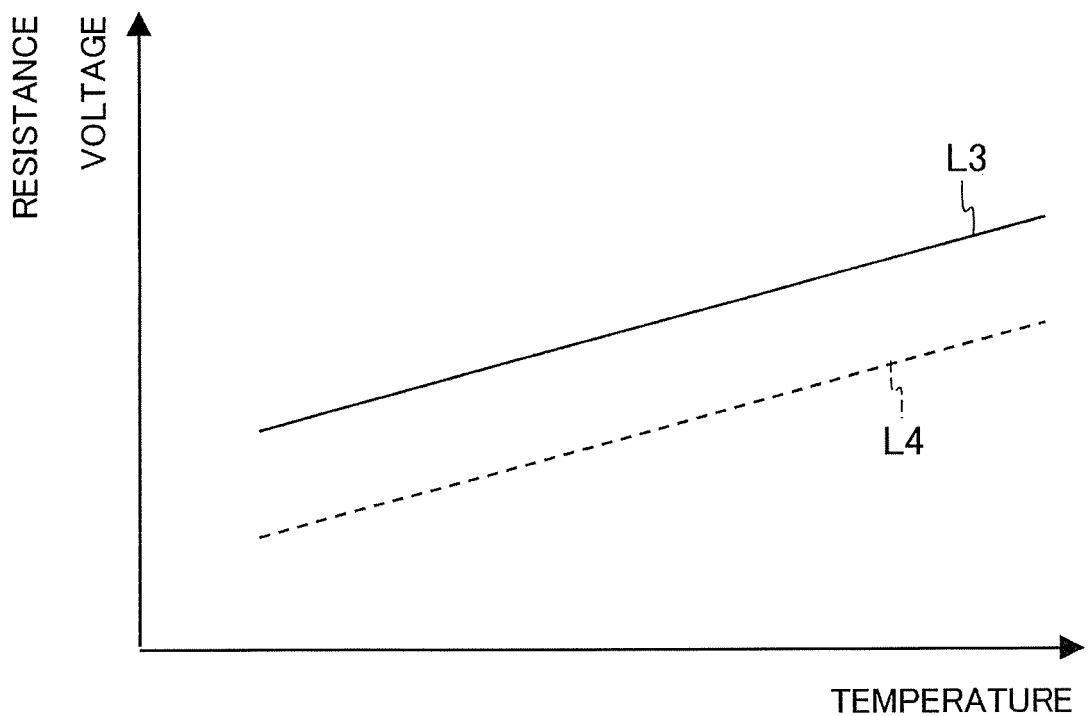
FIG. 6A is a relationship diagram illustrating the relationship between the on-resistance of the synchronous rectification transistor and the offset voltage in the backflow detection circuit of the first configuration example with respect to the temperature.

FIG. 6A is a relationship diagram illustrating the relationship between the on-resistance of the NMOS transistor 12 (see FIG. 1) and the offset voltage in the backflow detection circuit 30A with respect to the temperature. Here, the solid line L3 indicates the on-resistance value Ron12. The broken line L4 indicates the offset voltage value Vos of the comparator 31 (see FIG. 1).

The solid line L3 and the broken line L4 are both straight lines rising to the right containing the same slope. This indicates that the on-resistance value Ron12 and the offset voltage value Vos are both proportional to the temperature. Specifically, as the temperature increases, the voltage with the offset voltage value Vos increases along with the on-resistance value Ron12. That is, the offset voltage value Vos is automatically adjusted in the direction in which the efficiency is unlikely to decrease with respect to the temperature change of the on-resistance value Ron12, and the vicinity of the coil current $I_L$=0 amperes can be detected after the delay time td1 elapses.

Figure 6B:
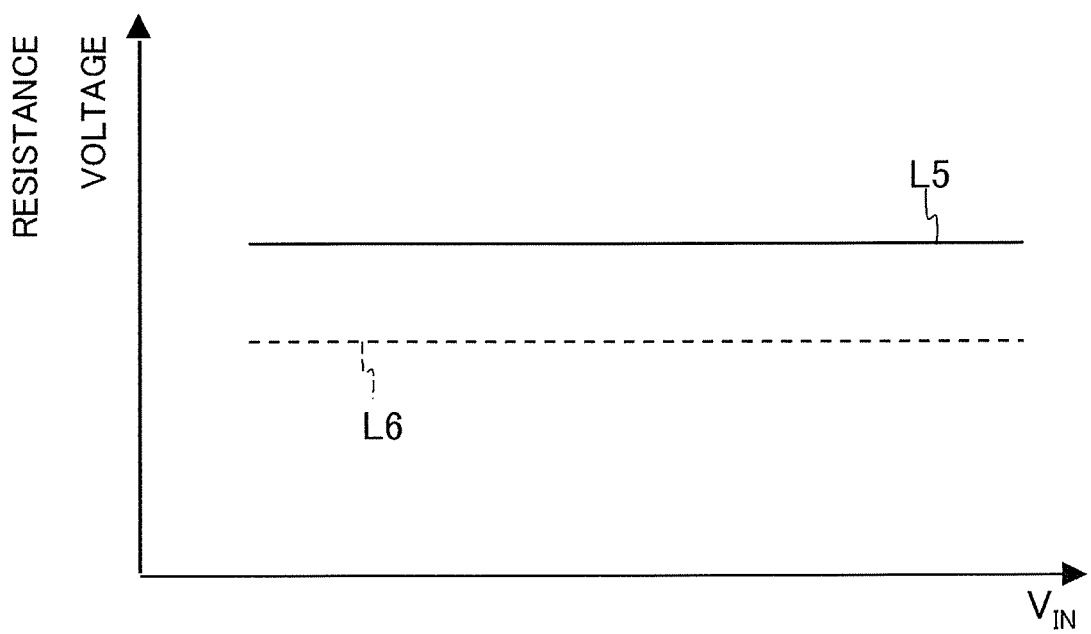
FIG. 6B is a relationship diagram illustrating the relationship between the on-resistance of the synchronous rectification transistor and the offset voltage in the backflow detection circuit of the first configuration example with respect to the input voltage.

FIG. 6B is a relationship diagram illustrating the relationship between the on-resistance of the NMOS transistor 12 (see FIG. 1) and the offset voltage in the backflow detection circuit 30A with respect to the input voltage Vin. Here, the solid line L5 indicates the on-resistance value Ron12. The broken line L6 indicates the offset voltage value Vos of the comparator 31 (see FIG. 1).

Both the solid line L5 and the broken line L6 are straight lines which are constant (with the slope of zero) with respect to the input voltage Vin. This indicates that the on-resistance value Ron12 and the offset voltage value Vos do not fluctuate with respect to the input voltage Vin; that is, they maintain constant values. This is because the voltage applied to the gate of the NMOS transistor 313 is fixed by the bias voltage $V_{BIAS}$.

According to the DC-DC converter 1A configured in this way, the offset voltage value Vos is automatically adjusted in the direction in which the efficiency is unlikely to decrease in response to environmental changes such as the temperature or the power supply voltage.

Further, the offset voltage value Vos is automatically adjusted in the direction in which the efficiency is unlikely to decrease even if the manufacturing process varies. In the DC-DC converter 1A, if the timing at which the NMOS transistor 12 is turned off is set, for example, to that the coil current $I_L$ is in the vicinity of the coil current $I_L$=0 amperes where high efficiency can be obtained, it is possible to suppress a decrease in the efficiency of the DC-DC converter 1A due to the change of the on-resistance value Ron12.

Further, according to the DC-DC converter 1A, since the current consumption does not increase, the power conversion efficiency can be stabilized with respect to the change of the on-resistance value Ron12 without increasing the power consumption.

Further, according to the DC-DC converter 1A, since the voltage applied to the gate of the NMOS transistor 313 which generates the offset voltage is fixed by the bias voltage $V_{BIAS}$, it does not depend on the input voltage Vin.

Second Embodiment

Figure 7:
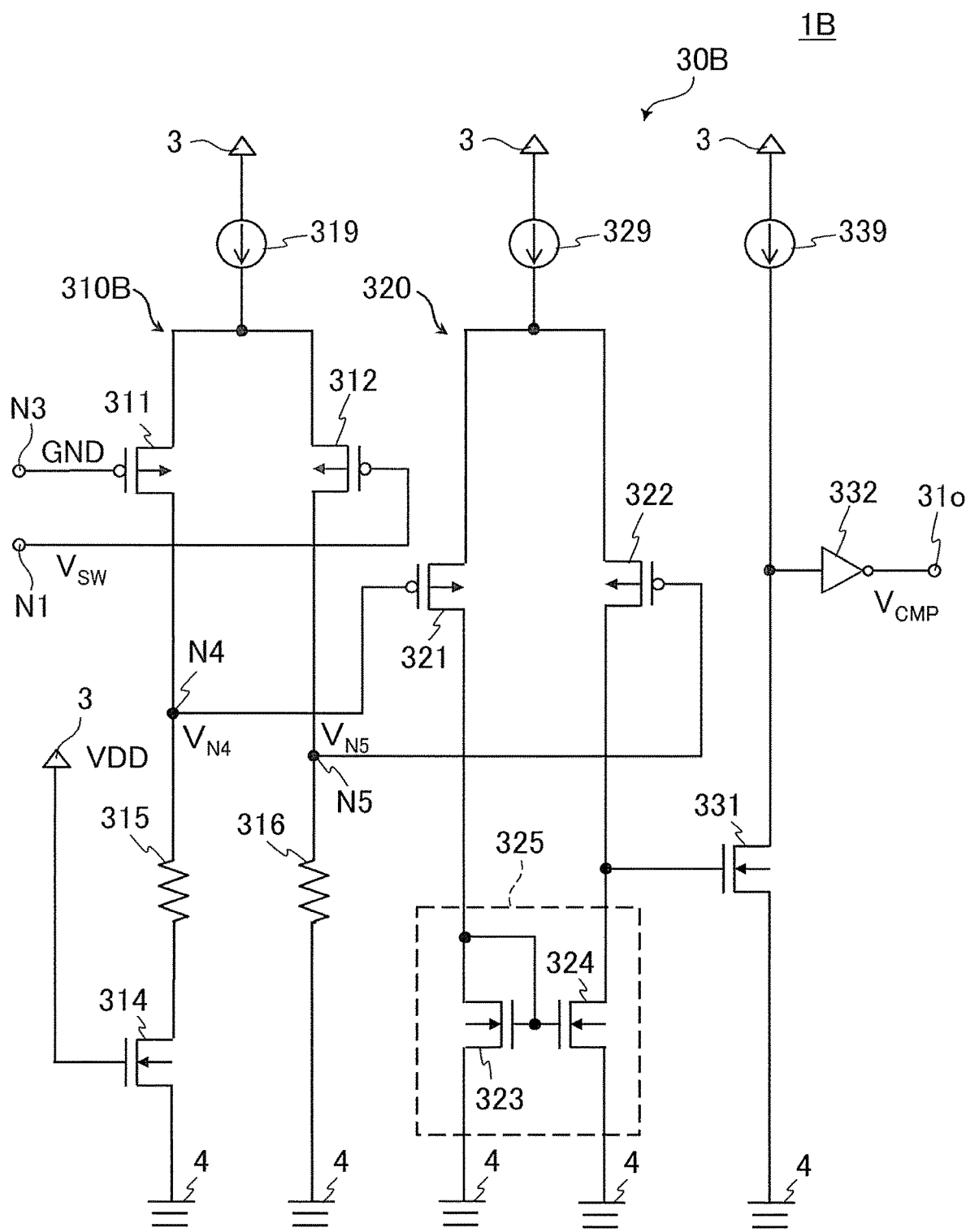
FIG. 7 is a circuit diagram illustrating a configuration example (second configuration example) of a backflow detection circuit and a DC-DC converter respectively according to a second embodiment.

FIG. 7 is a circuit diagram illustrating a configuration example (second configuration example) of a backflow detection circuit 30B in a DC-DC converter 1B. The backflow detection circuit 30B is an example of a backflow detection circuit according to a second embodiment, and the DC-DC converter 1B is an example of a DC-DC converter according to the second embodiment.

The DC-DC converter 1B differs from the DC-DC converter 1A in that the DC-DC converter 1B includes the backflow detection circuit 30B instead of the backflow detection circuit 30A, but it is substantially the same in other respects. In the embodiment, the backflow detection circuit 30B will be mainly described, and the description repetitive with the first embodiment will be omitted.

The backflow detection circuit 30B differs from the backflow detection circuit 30A in that the backflow detection circuit 30B includes a first-stage differential input circuit 310B including an NMOS transistor 314 instead of the NMOS transistor 313 of the first-stage differential input circuit 310A, but it is substantially the same in other respects.

The NMOS transistor 314 as the fifth transistor differs from the NMOS transistor 313 in that its gate connection destination is different, but it is substantially the same in other respects. The NMOS transistor 314 includes a gate connected to the power supply terminal 3 as a power supply terminal for supplying the voltage VDD.

Figure 8A:
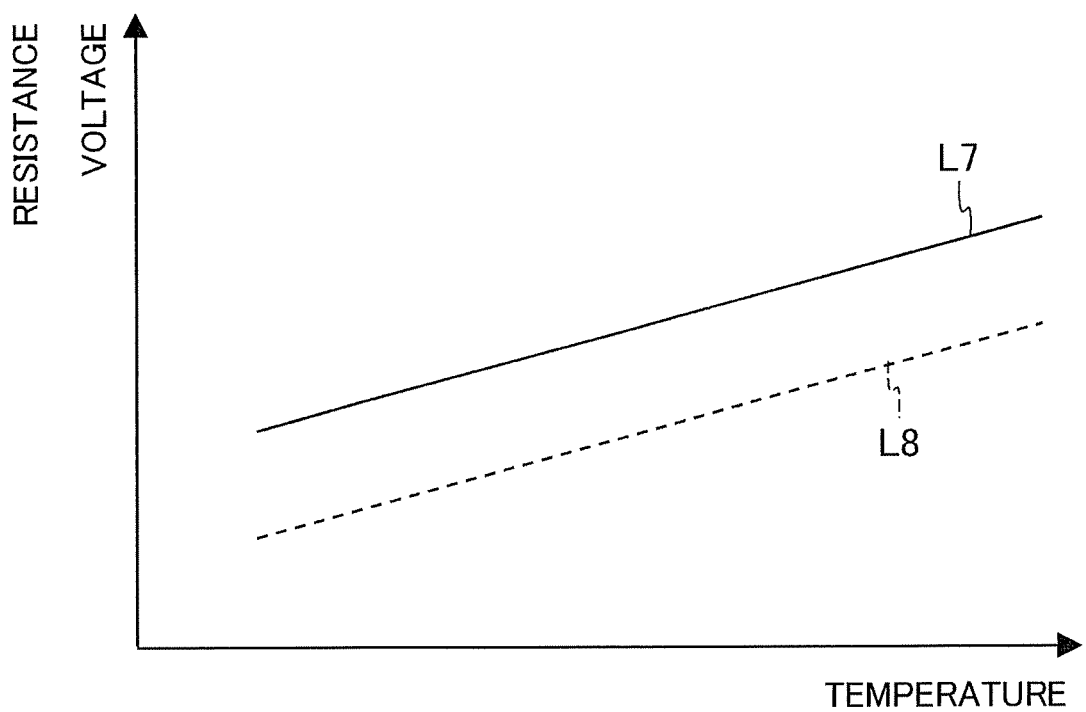
FIG. 8A is a relationship diagram illustrating the relationship between the on-resistance of the synchronous rectification transistor and the offset voltage in the backflow detection circuit of the second configuration example with respect to the temperature.

FIG. 8A is a relationship diagram illustrating the relationship between the on-resistance of the NMOS transistor 12 (see FIG. 1) and the offset voltage in the backflow detection circuit 30B with respect to the temperature. Here, the solid line L7 indicates the on-resistance value Ron12. The broken line L8 indicates the offset voltage value Vos of the comparator 31 (see FIG. 1).

The solid line L7 and the broken line L8 are both straight lines rising to the right containing the same slope. This indicates that the on-resistance value Ron12 and the offset voltage value Vos are both proportional to the temperature. Specifically, as the temperature increases, the offset voltage value Vos increases along with the on-resistance value Ron12. That is, the offset voltage value Vos is automatically adjusted in the direction in which the efficiency is unlikely to decrease with respect to the temperature change of the on-resistance value Ron12, and the vicinity of the coil current $I_L$=0 amperes can be detected after the delay time td1 elapses.

Figure 8B:
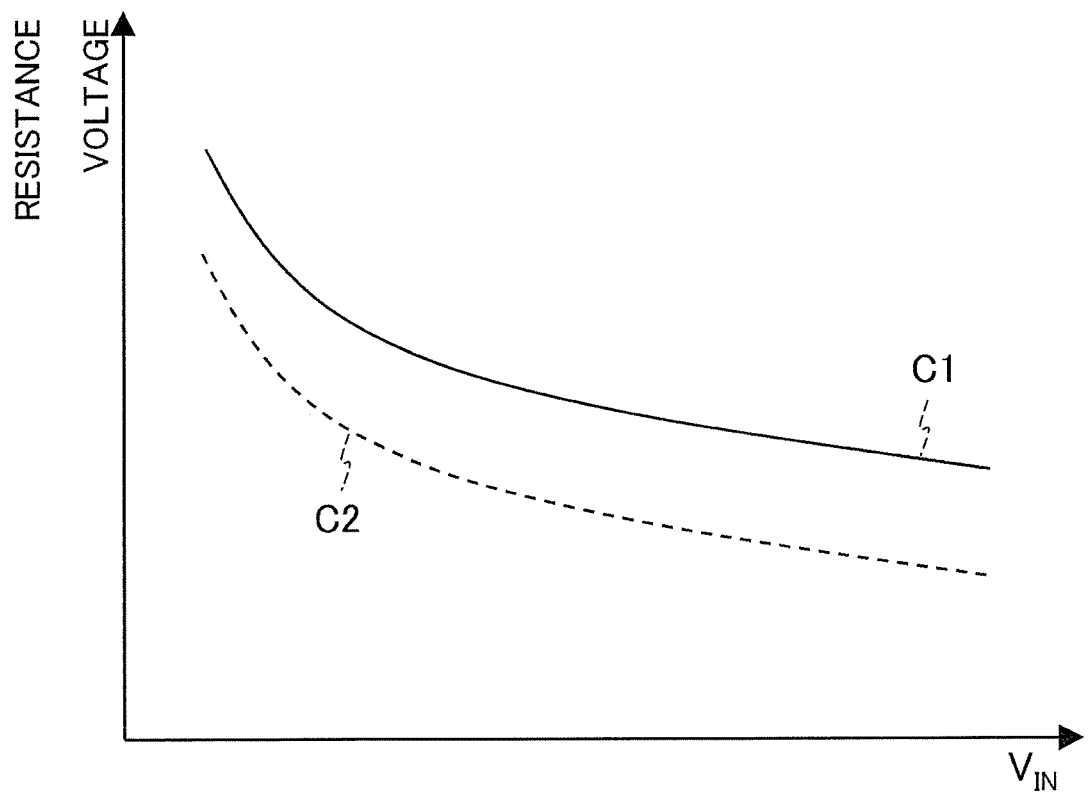
FIG. 8B is a relationship diagram illustrating the relationship between the on-resistance of the synchronous rectification transistor and the offset voltage in the backflow detection circuit of the second configuration example with respect to the input voltage.

FIG. 8B is a relationship diagram illustrating the relationship between the on-resistance value Ron12 of the NMOS transistor 12 (see FIG. 1) and the offset voltage in the backflow detection circuit 30B with respect to the input voltage Vin. Here, the solid line C1 indicates the on-resistance value Ron12. The broken line C2 indicates the offset voltage value Vos of the comparator 31 (see FIG. 1).

The solid line C1 and the broken line C2 are curves indicating an inverse proportionality. The voltage applied to the gate of the NMOS transistor 314 is the voltage VDD. The offset voltage value Vos is inversely proportional to the voltage VDD, and if the input voltage Vin is the voltage VDD, the offset voltage value Vos changes with respect to the change of the input voltage Vin in synchronization with the on-resistance value Ron12. That is, the offset voltage value Vos is automatically adjusted with respect to the change of the input voltage Vin in synchronization with the change of the on-resistance value Ron12.

According to the DC-DC converter 1B configured in this way, the same operations and effects as those of the DC-DC converter 1A can be obtained. That is, according to the DC-DC converter 1B, the offset voltage value Vos is automatically adjusted in the direction in which the efficiency is unlikely to decrease in response to environmental changes such as the temperature or the power supply voltage. Further, the offset voltage value Vos is automatically adjusted in the direction in which the efficiency is unlikely to decrease even if the manufacturing process varies.

In the DC-DC converter 1B, if the timing at which the NMOS transistor 12 is turned off is set, for example, to that the coil current $I_L$ is in the vicinity of the coil current $I_L$=0 amperes where high efficiency can be obtained, it is possible to suppress a decrease in the power conversion efficiency due to the change of the on-resistance value Ron12.

Further, according to the DC-DC converter 1B, since the current consumption does not increase, the power conversion efficiency can be stabilized with respect to the change of the on-resistance value Ron12 without increasing the power consumption.

Further, according to the DC-DC converter 1B, since the voltage applied to the gate of the NMOS transistor 314 which generates the offset voltage value Vos is the voltage VDD, the offset voltage value Vos changes with respect to the change of the input voltage Vin in synchronization with the on-resistance value Ron12. Thus, the DC-DC converter 1B has an advantage that it is less affected by the change of the input voltage Vin than the DC-DC converter 1A.

Third Embodiment

Figure 9:
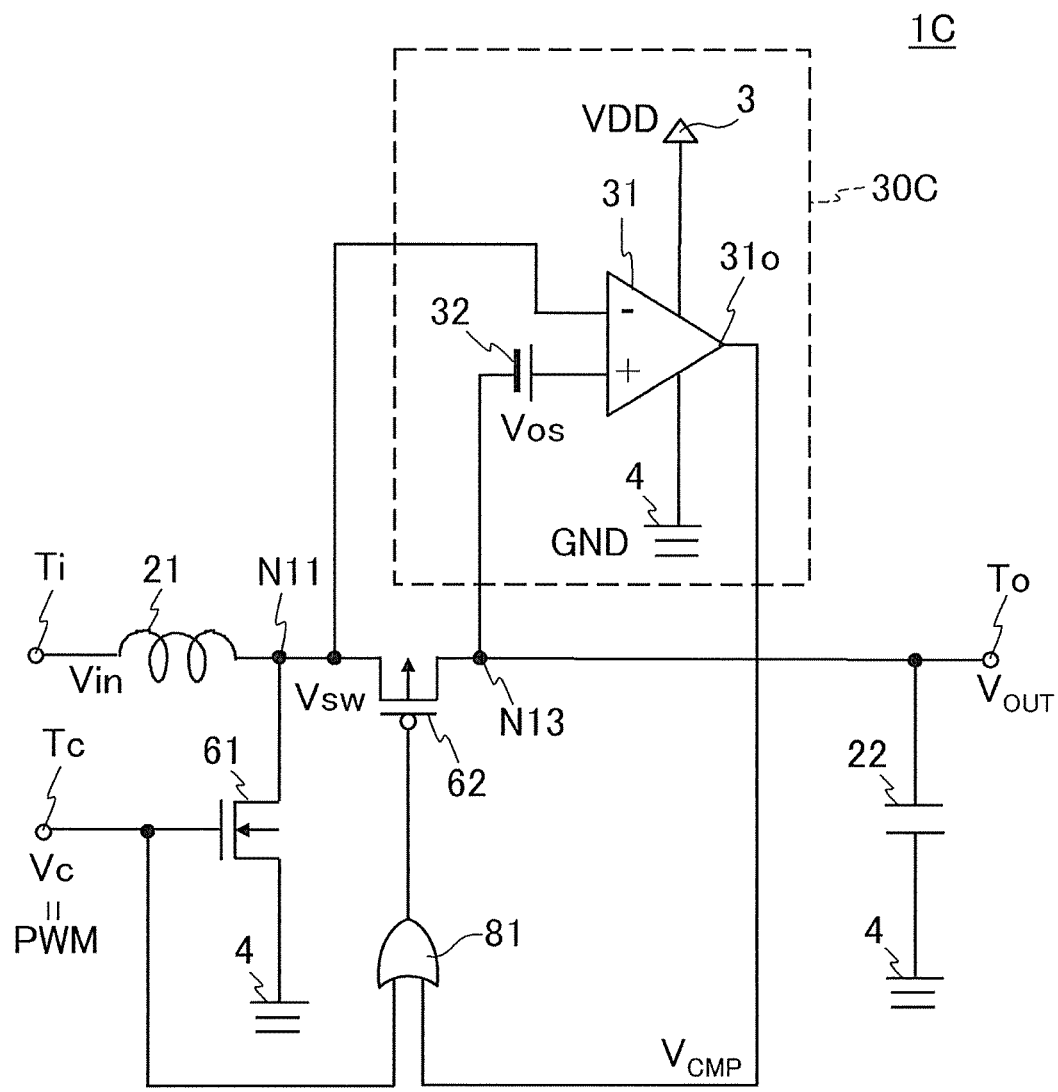
FIG. 9 is a circuit diagram of a DC-DC converter according to a third embodiment of the present invention.

FIG. 9 is a circuit diagram of a DC-DC converter 1C which is an example of a DC-DC converter according to a third embodiment.

The DC-DC converter 1C differs from the DC-DC converter 1A in that the DC-DC converter 1C includes an NMOS transistor 61, a PMOS transistor 62, a backflow detection circuit 30C and an OR circuit 81 instead of the PMOS transistor 11, the NMOS transistor 12, the backflow detection circuit 30A, and the inverter 41 and the NAND circuit 42, respectively, and also differs from the DC-DC converter 1A in the disposition of the inductor 21, but it is substantially the same in other respects. In the embodiment, the description repetitive with the first and second embodiments will be omitted.

The DC-DC converter 1C is a so-called synchronous rectification type step-up DC-DC converter. The DC-DC converter 1C includes the NMOS transistor 61, the PMOS transistor 62, the inductor 21, the output capacitor 22, the backflow detection circuit 30C, and the OR circuit 81 which configures a control circuit. The backflow detection circuit 30C is configured by the comparator 31 including an offset voltage.

In the DC-DC converter 1C, the inductor 21 includes a first end connected to the input terminal Ti and a second end connected to a node N11 between the NMOS transistor 61, the PMOS transistor 62, and the backflow detection circuit 30C.

The NMOS transistor 61 includes a gate connected to the control terminal Tc, a drain connected to the node N11, and a source connected to the ground terminal 4.

The PMOS transistor 62 as a synchronous rectification transistor includes a gate connected to an output port of the OR circuit 81, a drain connected to the node N11, and a source connected to the output terminal To.

The OR circuit 81 is connected to a first input terminal connected to the control terminal Tc and the gate of the NMOS transistor 61, a second input terminal connected to the output port 31o, and the gate of the PMOS transistor 62.

The backflow detection circuit 30C includes, equivalently, the comparator 31 and the offset voltage source 32 which generates the offset voltage including the offset voltage value Vos.

The comparator 31 includes an inverting input port (−) connected to the node N11 and a non-inverting input port (+) connected to a node N13 via the offset voltage source 32.

The offset voltage source 32 includes a positive electrode connected to the non-inverting input port (+) and a negative electrode connected to the node N13.

The comparator 31 contains a positive power supply port connected to the power supply terminal 3 and a negative power supply port connected to the ground terminal 4. The power supply terminal 3 as the power supply terminal supplies the voltage VDD as the power supply voltage. The ground terminal 4 as the power supply terminal supplies the ground voltage GND as the power supply voltage. The voltage VDD is a voltage higher than the ground voltage GND.

Figure 10:
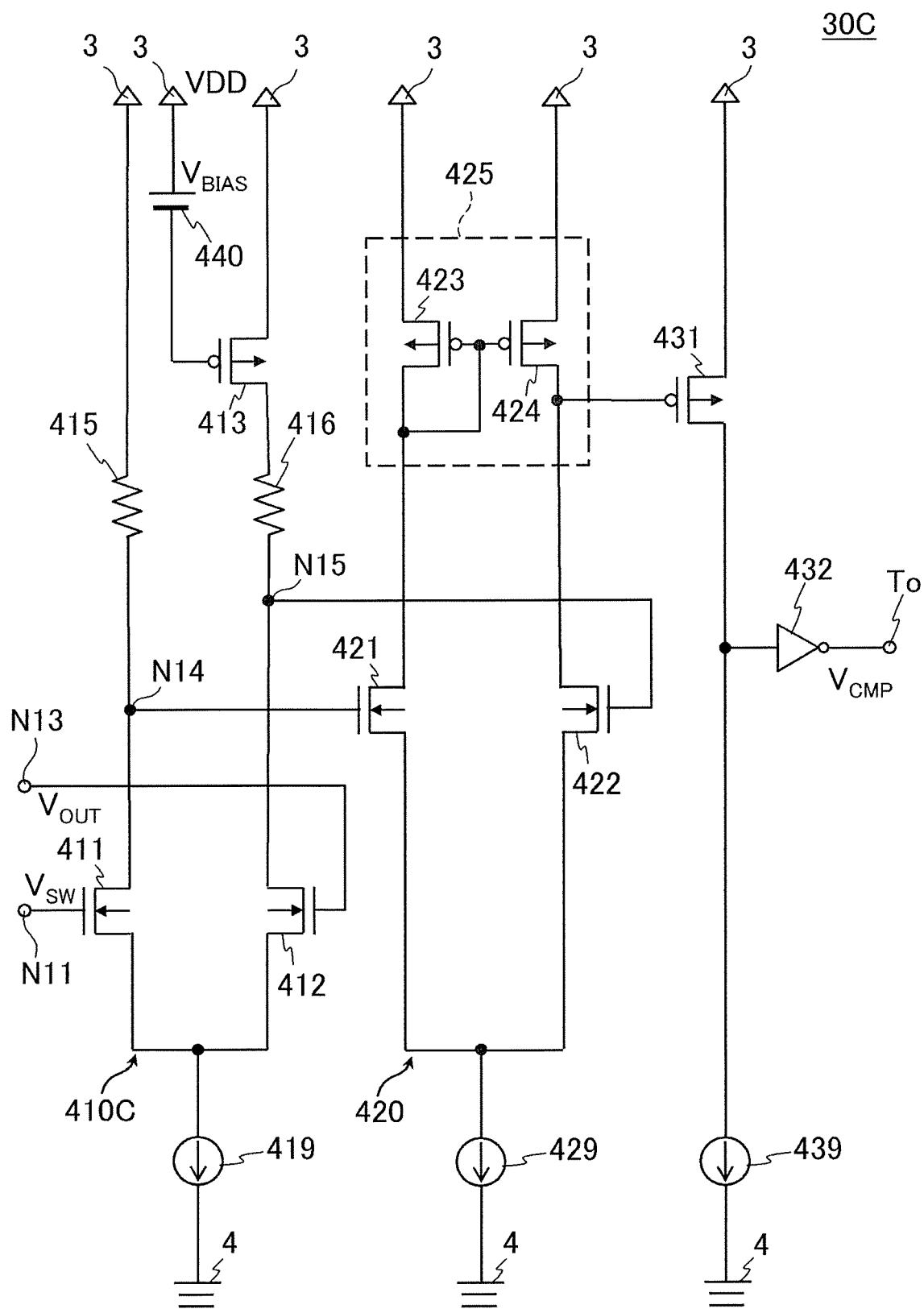
FIG. 10 is a circuit diagram illustrating a configuration example (third configuration example) of the backflow detection circuit according to the third embodiment.

FIG. 10 is a circuit diagram illustrating the backflow detection circuit 30C which is a third configuration example of the backflow detection circuit according to the third embodiment.

The backflow detection circuit 30C includes first- and second-stage differential input circuits 410C and 420 which configure a multi-stage (such as two-stage) differential input circuit, a PMOS transistor 431, an inverter 432, and a constant current source 439 which sinks a constant current from the PMOS transistor 431 to the ground terminal 4.

The first-stage differential input circuit 410C includes an NMOS transistor 411 as a first transistor, an NMOS transistor 412 as a second transistor, a resistor 415 as a first resistor, and a resistor 416 as a second resistor. A constant current source 419 which sinks a constant current to the ground terminal 4 is connected between each source of the NMOS transistors 411 and 412 and the ground terminal 4. Further, the first-stage differential input circuit 410C further includes a PMOS transistor 413 as a p-type fifth transistor which is of the same conductive type as the PMOS transistor 62.

The NMOS transistor 411 includes a gate connected to the node N11 as a first input port. The NMOS transistor 412 includes a gate connected to the node N13 as a second input port.

The resistors 415 and 416 are load resistors in the first-stage differential input circuit 410C. The resistors 415 and 416 are connected in series with the NMOS transistors 411 and 412, respectively. Here, the connection point between the resistor 415 and a drain of the NMOS transistor 411 is referred to as a node N14, and the connection point between the resistor 416 and a drain of the NMOS transistor 412 is referred to as a node N15.

The resistor 415 includes a first end connected to the drain of the NMOS transistor 411 and a second end connected to the power supply terminal 3. The resistor 416 includes a first end, as one end, connected to the drain of the NMOS transistor 412 and a second end, as the other end with respect to the one end, connected to a drain of the PMOS transistor 413. The resistance values of the resistors 415 and 416 may be the same value or different values.

The PMOS transistor 413 includes a gate connected to a bias circuit 440 which supplies the bias voltage $V_{BIAS}$, the drain connected to the second end of the resistor 416, and a source connected to the power supply terminal 3.

The second-stage differential input circuit 420 includes an NMOS transistor 421 as a third transistor and an NMOS transistor 422 as a fourth transistor. A constant current source 429 which sinks a constant current to the ground terminal 4 is connected between each source of the NMOS transistors 421 and 422 and the ground terminal 4.

A drain of a PMOS transistor 423 is connected to a drain of the NMOS transistor 421. A drain of a PMOS transistor 424 is connected to a drain of the NMOS transistor 422. The constant current source 429 which sinks a constant current to the ground terminal 4 is connected between each source of the NMOS transistors 421 and 422 and the ground terminal 4.

The NMOS transistor 421 includes a gate connected to the node N14. The NMOS transistor 422 includes a gate connected to the node N15.

The PMOS transistor 423 includes the drain connected to the drain of the NMOS transistor 421, a gate connected (short-circuited) to its own drain, and a source connected to the power supply terminal 3. The PMOS transistor 424 includes a gate connected to the gate and the drain of the PMOS transistor 423, the drain connected to the drain of the NMOS transistor 422, and a source connected to the power supply terminal 3. The PMOS transistors 423 and 424 configure a current mirror circuit 425.

The PMOS transistor 431 is an output transistor in the backflow detection circuit 30C. The PMOS transistor 431 includes a gate connected to a node between the NMOS transistor 422 and the PMOS transistor 424, a source connected to the power supply terminal 3, and a drain connected to the ground terminal 4 via the constant current source 439. The inverter 432 includes an input port connected to a node between the constant current source 439 and the PMOS transistor 431, and an output port connected to the output port 31o.

According to the DC-DC converter 1C configured as described above, the same operations and effects as those of the DC-DC converter 1A can be obtained. That is, an offset voltage is generated by the on-resistance of the PMOS transistor 413 of the same conductive type as the PMOS transistor 62 serving as the synchronous rectification transistor. Since the PMOS transistor 62 and the PMOS transistor 413 are of the same conductive type, even if the on-resistance value Ron62 of the PMOS transistor 62 changes due to the temperature, the input voltage or the manufacturing variation (PVT variation), the on-resistance value Ron413 of the PMOS transistor 413 changes in the same way. The offset voltage value Vos automatically changes in the direction in which the power conversion efficiency is unlikely to decrease in accordance with the change of the on-resistance value Ron413 in response to the change of the on-resistance value Ron62, and the power conversion efficiency can be less likely to decrease.

As described above, according to the DC-DC converter 1C, the offset voltage value Vos is automatically adjusted in the direction in which the efficiency is unlikely to decrease with respect to environmental changes such as the temperature or the power supply voltage even for the step-up DC-DC converter. Further, the offset voltage value Vos is automatically adjusted in the direction in which the power conversion efficiency is unlikely to decrease even if the manufacturing process varies. In the DC-DC converter 1C, if the timing at which the PMOS transistor 62 is turned off is set, for example, to that the coil current $I_L$ is in the vicinity of the coil current $I_L=0$ amperes where high efficiency can be obtained, it is possible to suppress a decrease in the efficiency of the DC-DC converter 1C due to the change of the on-resistance of the PMOS transistor 62.

According to the DC-DC converter 1C, since the current consumption does not increase, the power conversion efficiency can be stabilized with respect to the change of the on-resistance value Ron62 without increasing the power consumption.

Further, according to the DC-DC converter 1C, since the voltage applied to the gate of the PMOS transistor 413 which generates the offset voltage is fixed by the bias voltage $V_{BIAS}$, it does not depend on the input voltage Vin.

Fourth Embodiment

Figure 11:
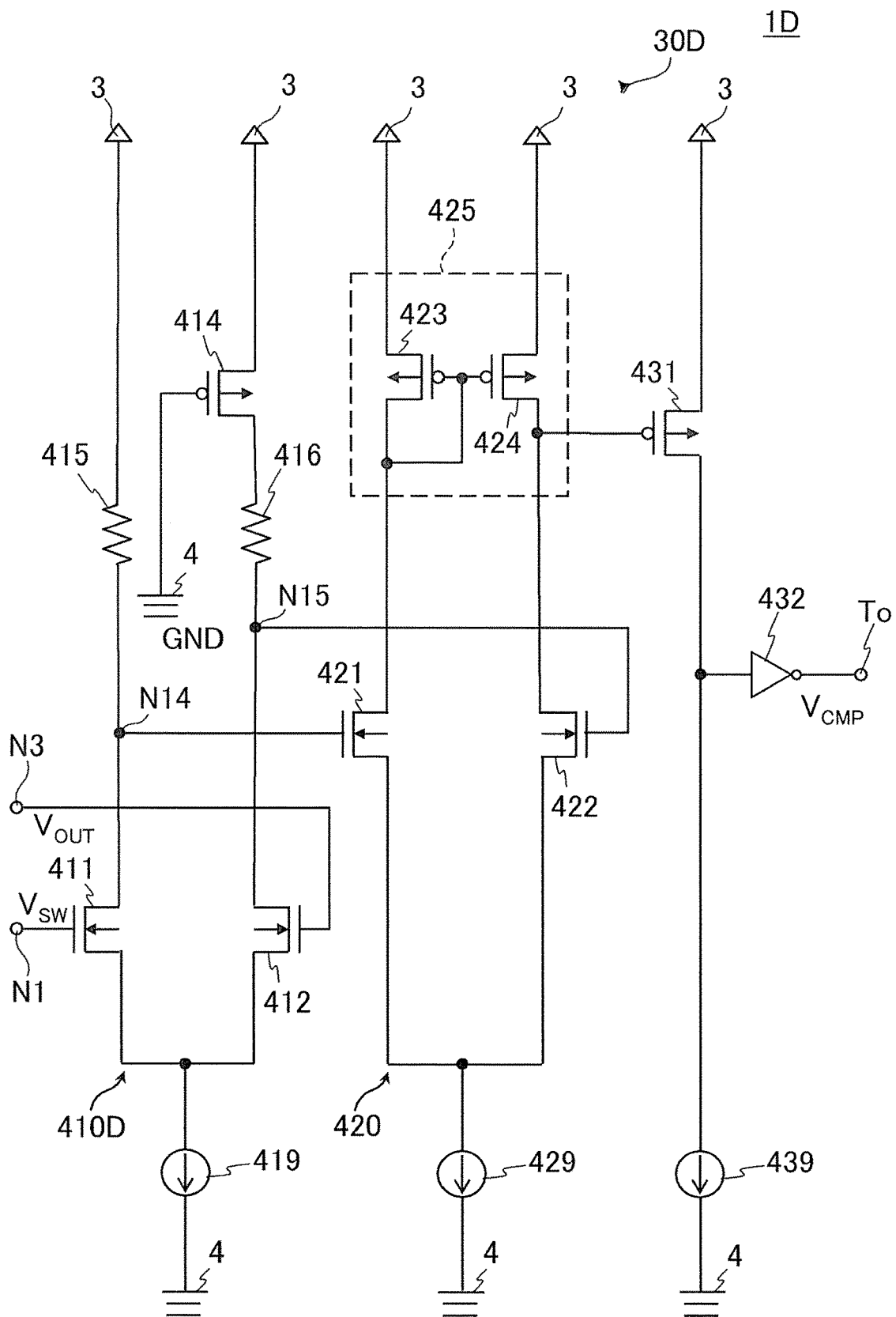
FIG. 11 is a circuit diagram illustrating a configuration example (fourth configuration example) of a backflow detection circuit and a DC-DC converter respectively according to a fourth embodiment.

FIG. 11 is a circuit diagram illustrating a configuration example (fourth configuration example) of a backflow detection circuit 30D in a DC-DC converter 1D which is an example of a DC-DC converter according to a fourth embodiment.

The DC-DC converter 1D differs from the DC-DC converter 1C in that the DC-DC converter 1D includes the backflow detection circuit 30D instead of the backflow detection circuit 30C, but it is substantially the same in other respects. In the embodiment, the backflow detection circuit 30D will be mainly described, and the description repetitive with the first to third embodiments will be omitted.

The backflow detection circuit 30D differs from the backflow detection circuit 30C in that the backflow detection circuit 30D includes a first-stage differential input circuit 410D including a PMOS transistor 414 instead of the PMOS transistor 413 of the first-stage differential input circuit 410C, but it is substantially the same in other respects.

The PMOS transistor 414 as the fifth transistor differs from the PMOS transistor 413 in that its gate connection destination is different, but it is substantially the same in other respects. The PMOS transistor 414 includes a gate connected to the ground terminal 4 as a power supply terminal for supplying the ground voltage GND.

According to the DC-DC converter 1D configured as described above, the same operations and effects as those of the DC-DC converter 1B can be obtained. If the timing at which the PMOS transistor 62 is turned off is set, for example, to that the coil current $I_L$ is in the vicinity of the coil current $I_L=0$ amperes where high efficiency can be obtained, it is possible to suppress a decrease in the power conversion efficiency of the DC-DC converter 1D due to the change of the on-resistance of the PMOS transistor 62.

Further, according to the DC-DC converter 1D, since the current consumption does not increase, the power conversion efficiency can be stabilized with respect to the change of the on-resistance of the PMOS transistor 62 without increasing the power consumption. Further, according to the DC-DC converter 1D, since the voltage applied to the gate of the PMOS transistor 414 which generates the offset voltage is the ground voltage GND, the offset voltage value Vos changes with respect to the input voltage Vin in synchronization with the on-resistance value Ron62. Thus, the DC-DC converter 1D has an advantage that it is less affected by the change of the input voltage than the DC-DC converter 1C.

According to any of the embodiments, even if the resistance value of the on-resistance of the synchronous rectification transistor fluctuates, a decrease in the power conversion efficiency can be suppressed without increasing the current consumption.

Further, the present invention is not limited to the above-described embodiments, and can be also implemented in various forms other than the above-described embodiments in its implementation stage. Various omissions, replacements and changes may be made without departing from the gist of the present invention. These embodiments and modifications thereof are included in the scope and gist of the present invention, and are also included in the scope of the present invention described in the claims and the equivalent scope thereof.

What is claimed is:

1. A detection circuit which includes two input terminals to be connected to a synchronous rectification transistor, and which detects a reverse current based on a voltage across the synchronous rectification transistor, the detection circuit comprising:
   a first-stage differential input circuit including a first input port as one of the two input terminals, a second input port as the other one of the two input terminals, a first transistor containing a gate connected to the first input port, a first resistor containing first and second ends, the first end being connected in series with the first transistor, a second transistor containing a gate connected to the second input port, a second resistor connected in series with the second transistor, and a fifth transistor being of a same conductive type as the synchronous rectification transistor, the fifth transistor containing a drain connected to the second end of the first resistor; and
   a second-stage differential input circuit including a third transistor containing a gate connected to a node between the first transistor and the first resistor, and a fourth transistor containing a gate connected to a node between the second transistor and the second resistor.

2. The detection circuit according to claim 1, wherein the fifth transistor contains a gate connected to a bias circuit configured to supply a predetermined bias voltage.

3. The detection circuit according to claim 1, wherein the fifth transistor contains a gate connected to a terminal to which a power supply voltage is supplied.

4. The detection circuit according to claim 3, wherein the fifth transistor is an NMOS transistor containing the gate connected to the terminal, and wherein the terminal is a power supply terminal to which a voltage higher than a ground voltage is supplied as the power supply voltage.

5. The detection circuit according to claim 3, wherein the fifth transistor is a PMOS transistor containing the gate connected to the terminal, and wherein the terminal is a ground terminal to which a ground voltage is supplied as the power supply voltage.

6. A DC-DC converter of a synchronous rectification type including a synchronous rectification transistor and a backflow detection circuit which detects a reverse current based on a voltage across the synchronous rectification transistor, the backflow detection circuit comprising:
   a first-stage differential input circuit including a first input port, a second input port, a first transistor containing a gate connected to the first input port, a first resistor containing first and second ends, the first end being connected in series with the first transistor, a second transistor containing a gate connected to the second input port, a second resistor connected in series with the second transistor, and a fifth transistor being of a same conductive type as the synchronous rectification transistor, the fifth transistor containing a drain connected to the second end of the first resistor; and
   a second-stage differential input circuit including a third transistor containing a gate connected to a node between the first transistor and the first resistor, and a fourth transistor containing a gate connected to a node between the second transistor and the second resistor.

7. The DC-DC converter according to claim 6, wherein the fifth transistor contains a gate connected to a bias circuit configured to supply a predetermined bias voltage.

8. The DC-DC converter according to claim 6, wherein the fifth transistor contains a gate connected to a terminal to which a power supply voltage is supplied.

9. The DC-DC converter according to claim 8, wherein the fifth transistor is an NMOS transistor containing the gate connected to the terminal, and wherein the terminal is a power supply terminal to which a voltage higher than a ground voltage is supplied as the power supply voltage.

10. The DC-DC converter according to claim 8, wherein the fifth transistor is a PMOS transistor containing the gate connected to the terminal, and wherein the terminal is a ground terminal to which a ground voltage is supplied as the power supply voltage.

* * * * *